(12) United States Patent
Kaneko et al.

(10) Patent No.: US 11,189,579 B2
(45) Date of Patent: Nov. 30, 2021

(54) SEMICONDUCTOR MODULE AND SEMICONDUCTOR DEVICE USING THE SAME

(71) Applicant: Fuji Electric Co., Ltd., Kanagawa (JP)

(72) Inventors: Satoshi Kaneko, Nagano (JP); Naoyuki Kanai, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/589,689

(22) Filed: Oct. 1, 2019

(65) Prior Publication Data
US 2020/0161256 A1  May 21, 2020

(30) Foreign Application Priority Data
Nov. 15, 2018  (JP) .............................. JP2018-214652

(51) Int. Cl.
| | | |
|---|---|---|
| *H01L 23/60* | (2006.01) | |
| *H01L 23/367* | (2006.01) | |
| *H01L 25/07* | (2006.01) | |
| *H01L 25/16* | (2006.01) | |
| *H01L 23/31* | (2006.01) | |
| *H01L 23/40* | (2006.01) | |
| *H01L 25/18* | (2006.01) | |

(52) U.S. Cl.
CPC .......... *H01L 23/60* (2013.01); *H01L 23/3107* (2013.01); *H01L 23/3675* (2013.01); *H01L 23/4006* (2013.01); *H01L 25/072* (2013.01); *H01L 25/162* (2013.01); *H01L 25/18* (2013.01); *H01L 2023/4087* (2013.01)

(58) Field of Classification Search
CPC ..... H01L 2924/181; H01L 2924/00012; H01L 2023/4087; H01L 2224/32225; H01L 23/3107; H01L 23/3121; H01L 23/3675; H01L 23/3735; H01L 23/4006; H01L 23/60; H01L 25/072; H01L 25/115; H01L 25/162; H01L 25/18
See application file for complete search history.

(56) References Cited

U.S. PATENT DOCUMENTS

| | | | |
|---|---|---|---|
| 2017/0047268 A1* | 2/2017 | Terasaki | ................ H01L 23/367 |
| 2018/0199472 A1* | 7/2018 | Nakanishi | .......... H05K 7/20963 |

FOREIGN PATENT DOCUMENTS

| | | |
|---|---|---|
| JP | 2011-40565 A | 2/2011 |

\* cited by examiner

*Primary Examiner* — Mohammed Shamsuzzaman
(74) *Attorney, Agent, or Firm* — Chen Yoshimura LLP

(57) ABSTRACT

A semiconductor module internally includes semiconductor elements and multilayer substrates on which the semiconductor elements are arranged. The semiconductor module further includes, in a case, fastening portions for fastening a cooler such as conductive radiating fins or water-cooling jackets, for example. In the semiconductor module, side faces of heat radiating plates formed on the rear surface sides of the multilayer substrates are electrically connected to the fastening portions in the case by conductive connectors.

6 Claims, 12 Drawing Sheets

SEMICONDUCTOR MODULE AND SEMICONDUCTOR DEVICE USING THE SAME

BACKGROUND OF THE INVENTION

Technical Field

The present invention relates to a semiconductor module and a semiconductor device using that semiconductor module.

Background Art

A semiconductor module includes a semiconductor element and a multilayer substrate on which the semiconductor element is arranged. The multilayer substrate includes an insulating board, a conductive board which is formed on the front surface of the insulating board and on which the semiconductor element is arranged, and a heat radiating plate formed on the rear surface of the insulating board. Semiconductor modules of this type are used together with coolers as semiconductor devices, for example. In such a semiconductor device, a cooler such as electrically conductive radiating fins or water-cooling jackets is fixed to the heat radiating plate of the semiconductor module via an electrically insulating thermally conductive paste or thermally conductive sheet. This allows heat generated by semiconductor elements and the like within the semiconductor module during operation to be transmitted to the cooler, thereby preventing overheating of the semiconductor module. See Patent Document 1, for example.

RELATED ART DOCUMENTS

Patent Documents

Patent Document 1: Japanese Patent Application Laid-Open Publication No. 2011-40565

SUMMARY OF THE INVENTION

In this type of semiconductor device, partial discharges sometimes occur within the multilayer substrate during operation, particularly between the heat radiating plate and the cooler. This is caused by the difference in electric potential that develops between the heat radiating plate and the cooler as a result of the heat radiating plate and the cooler being electrically insulated from one another. This difference in electric potential between the heat radiating plate and the cooler, and particularly large differences in electric potential that develop during high-voltage operation, sometimes cause partial discharges to occur through the electrically insulating thermally conductive paste or thermally conductive sheet. Such partial discharges create electromagnetic noise which can cause the semiconductor device to malfunction, thereby reducing the reliability of the device.

The present invention was made in light of the foregoing and aims to provide a semiconductor module and a semiconductor device that make it possible to suppress the occurrence of partial discharges.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor module, comprising: a multilayer substrate including an insulating board, a conductive board formed on a front surface of the insulating board, and a heat radiating plate formed on a rear surface of the insulating board; a semiconductor element arranged on the conductive board; a case that houses at least the semiconductor element and a front surface of the multilayer substrate and includes a fastening portion to receive an electrically conductive fastener; and a connector electrically connecting a side face of the heat radiating plate to the fastening portion so as to make electrical contact with the electrically conductive fastener when the fastening portion receives the electrically conductive fastener.

The connector may be connected to the side face of the heat radiating plate and to the fastening portion. Moreover, the connector may be made of an elastic material.

A rear surface of the heat radiating plate may be exposed from a bottom surface of the case. Moreover, the rear surface of the heat radiating plate may protrude out from the bottom surface of the case, and at least a portion of the side face of the heat radiating plate may be exposed from the case.

A groove in which to arrange the connector may be formed in a bottom surface of the case between the heat radiating plate and the fastening portion, and a portion of the side face of the heat radiating plate may be exposed from the case by the groove.

The connector may be connected to the side face of the heat radiating plate exposed from the case and to the fastening portion. Moreover, a notch in which the connector is arranged may be formed in the side face of the heat radiating plate.

A through hole may be formed in the fastening portion spanning from an upper surface to a bottom surface thereof, and the connector may be electrically connected to the side face of the heat radiating plate and to an inner surface of the through hole in the fastening portion. A conductive ring may be further included within an inner periphery of the through hole, and the connector may electrically connect the side face of the heat radiating plate to the ring in the fastening portion.

A plurality of the heat radiating plates that are separated from one another may be further included, and a connector that electrically connects the plurality of heat radiating plates together via side faces of the heat radiating plates may be further included.

The fastening portion of the case may further include a contact terminal, one end of the contact terminal being connected to the connector within the fastening portion and another end of the contact terminal protruding out from the case at the fastening portion.

In another aspect, the present disclosure provides a semiconductor device, comprising: a semiconductor module including: a multilayer substrate including an insulating board, a conductive board formed on a front surface of the insulating board, and a heat radiating plate formed on a rear surface of the insulating board; a semiconductor element arranged on the conductive board; a case that houses at least the semiconductor element and a front surface of the multilayer substrate and includes a fastening portion to receive an electrically conductive fastener; and a connector electrically connecting a side face of the heat radiating plate to the fastening portion so as to make electrical contact with the electrically conductive fastener when the fastening portion receives the electrically conductive fastener; an electrically insulating thermally conductive member arranged on a bottom surface of the semiconductor module; a cooler arranged underneath the electrically insulating thermally conductive member; and said electrically conductive fastener fastening together the semiconductor module and the cooler, wherein the heat radiating plate is electrically connected to the cooler via the connector and the fastener.

The connector may be electrically and mechanically connected to the side face of the heat radiating plate and to the fastening portion. The fastener may be a screw. Moreover, the fastener may be a clamp. The fastening portion of the case may include a contact terminal, one end of the contact terminal being connected to the connector and another end of the contact terminal protruding out from the case at the fastening portion, and the clamp may be in contact with said another end of the contact terminal.

The above summary of the invention does not list all characterizing features of the present invention. Sub-combinations of these groups of characterizing features are also included within the invention.

The technology disclosed herein makes it possible to suppress the occurrence of partial discharges and to thereby prevent decreases in reliability.

It is to be understood that both the foregoing general description and the following detailed description are exemplary and explanatory, and are intended to provide further explanation of the invention as claimed.

DETAILED DESCRIPTION OF EMBODIMENTS

Figure 1A:
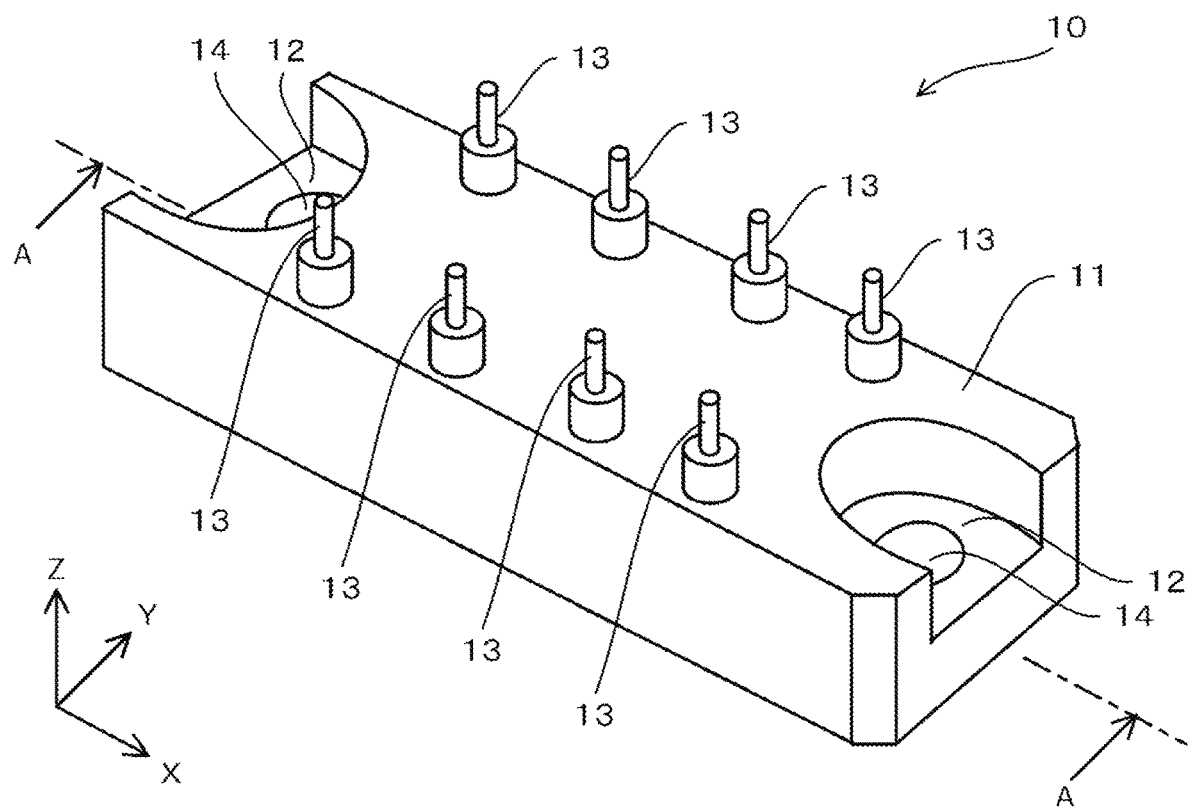
FIG. 1A is a perspective view of a semiconductor module according to Embodiment 1 of the present invention as viewed from an upper perspective direction.

Next, embodiments of the present invention will be described. In the following descriptions of the drawings, the same or similar reference characters will be used for components that are the same or similar. Note, however, that the drawings are only intended to be schematic illustrations, and the relationships between thickness and planar dimensions, the proportions between the thicknesses of each device and each component, and the like may be different from in the actual devices. Therefore, specific thicknesses and dimensions should be determined by referring to the descriptions below. Similarly, the illustrated dimensional relationships and proportions of components in the drawings may differ from one drawing to the next.

In the following descriptions of the drawings, directions are sometimes indicated using the terms "X-axis direction", "Y-axis direction", and "Z-axis direction". The X-axis direction and Y-axis direction are directions parallel to the bottom surface of a semiconductor module 10 (described later), for example. The Z-axis direction is a direction orthogonal to the bottom surface of the semiconductor module 10 (described later). The X-axis direction, Y-axis direction, and Z-axis direction are mutually orthogonal.

In the following descriptions, the positive Z-axis direction is sometimes referred to as "up", while the negative Z-axis direction is sometimes referred to as "down". The terms "up" and "down" do not necessarily refer to vertical directions relative to the earth's surface. In other words, the "up" and "down" directions are not limited to being in the direction of gravity. The terms "up" and "down" are merely convenient expressions for identifying relative positional relationships and do not limit the technical concepts of the present invention in any way. For example, the drawings can be rotated by 180° to make "up" become "down" and "down" become "up".

Furthermore, in the following descriptions, the expressions "front surface", "rear surface", "upper surface", and "bottom surface" are sometimes used to describe technical features. Surfaces on the positive Z-axis direction side are generally referred to as "front surfaces" or "upper surfaces", while surfaces on the negative Z-axis direction side are generally referred to as "rear surfaces" or "bottom surfaces". Moreover, in the following descriptions, the term "side face" refers to a surface that connects together a front surface and a rear surface. The term "side face" is not limited to referring to a surface parallel to the Z axis and can also refer to side faces such as slanted faces or irregular faces.

In addition, in the following descriptions, the term "plan view" refers to viewing from the direction normal to the bottom surface of the semiconductor module 10 (that is, from the Z-axis direction). The term "cross-sectional view" refers to viewing from a direction parallel to the bottom surface of the semiconductor module 10 (that is, from a direction orthogonal to the Z axis).

Moreover, in the following descriptions, the expression "electrically connected" is not limited to referring to objects that are directly connected together and also includes cases in which objects are connected together via a conductive bonding material such as solder or a metallic sintering material or via some other conductive member. The expression "electrically and mechanically connected" is not limited to referring to objects that are directly connected together and also includes cases in which objects are connected together via a conductive bonding material such as solder or a metallic sintering material.

Embodiment 1

Figure 1B:
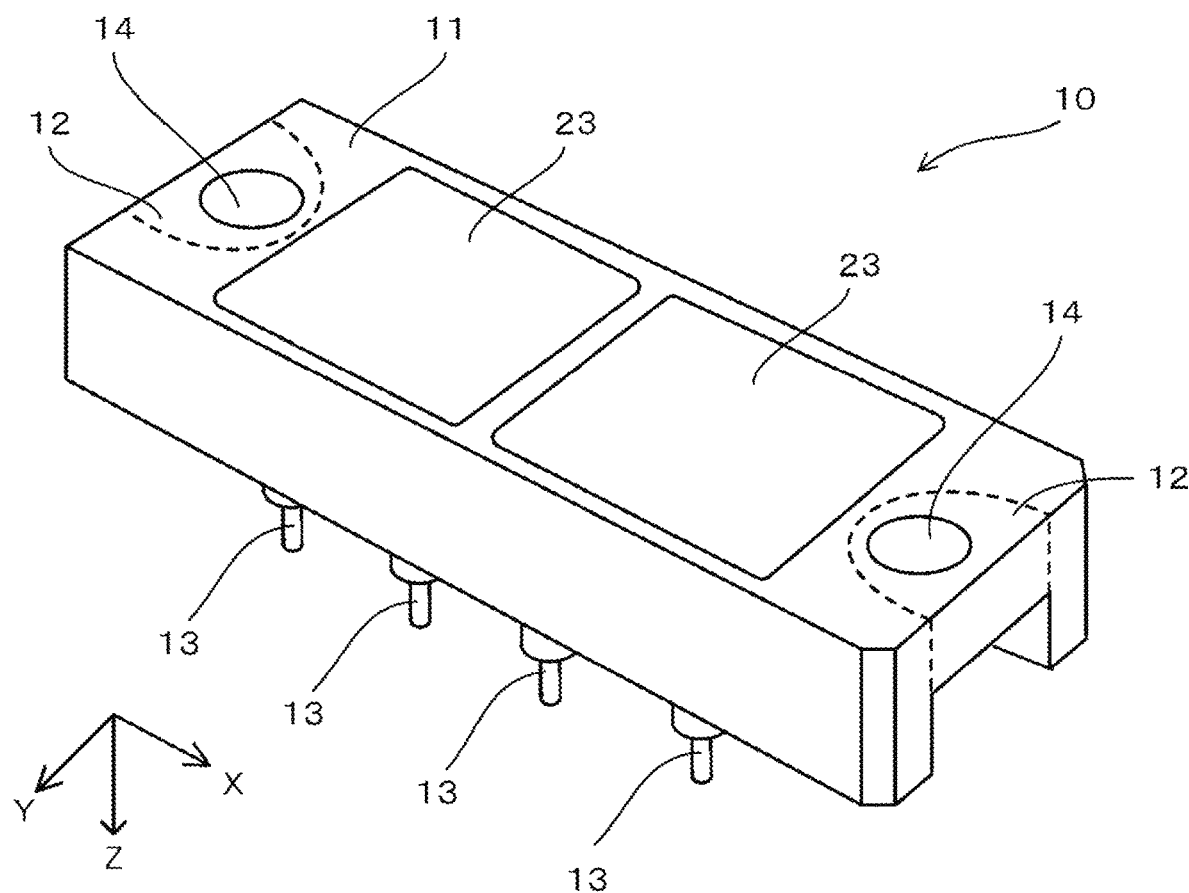
FIG. 1B is a perspective view of the semiconductor module according to Embodiment 1 of the present invention as viewed from a lower perspective direction.
Figure 1C:
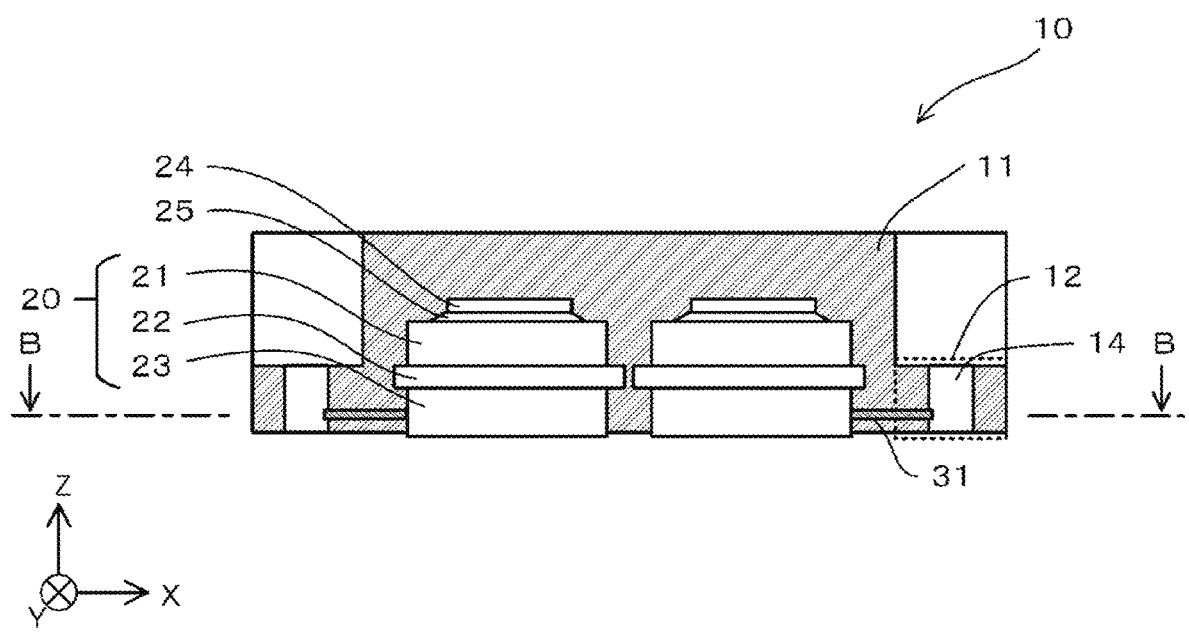
FIG. 1C is a cross-sectional view of the semiconductor module according to Embodiment 1 of the present invention.

Next, an embodiment will be described with reference to figures. A semiconductor module according to the present embodiment will be described with reference to FIGS. 1A to 1C. FIGS. 1A and 1B are perspective views of a semiconductor module 10. FIG. 1A illustrates the semiconductor module 10 as viewed from an upper perspective direction and shows the upper surface and several side faces of the semiconductor module 10. FIG. 1B illustrates the semiconductor module 10 as viewed from a lower perspective direction and shows the bottom surface and several side faces of the semiconductor module 10. FIG. 1C is a cross-sectional view taken along line A-A in FIG. 1A. Note that FIG. 1C schematically illustrates the primary components and does not show external connection terminals or internal wiring.

The semiconductor module 10 is substantially rectangular prism-shaped. The external shape of the semiconductor module 10 is primarily formed by a case 11. As illustrated in FIG. 1A, on the upper surface of the semiconductor module 10, the ends of external connection terminals 13 may protrude out from the case 11. Moreover, as illustrated in FIG. 1B, on the bottom surface of the semiconductor module 10, heat radiating plates 23 should be exposed from the case 11.

The semiconductor module 10 includes fastening portions 12 near both ends in the X-axis direction in FIG. 1A. The fastening portions 12 are portions in which fasteners are arranged in order to fasten the semiconductor module 10 to a cooler or the like (not illustrated in the figures). This will be described in more detail later. In the present example, the fastening portions 12 are included at a total of two locations near both lengthwise ends of the case 11 of the semiconductor module 10.

However, the positions and number of the fastening portions 12 are not limited to this example. For example, the fastening portions 12 may be arranged at a total of four locations at the respective four corners of the rectangular shape formed by the semiconductor module 10 when viewed from above. Moreover, the fastening portions 12 may be arranged at a total of two locations running along opposite sides of the rectangular shape formed by the semiconductor module 10 when viewed from above, for example. It is preferable that the fastening portions 12 be formed near the outer edges of the semiconductor module 10. Forming the fastening portions 12 near the outer edges of the semiconductor module 10 makes it possible to reliably fasten the cooler or the like even if bending or warping occurs in the bottom surface of the semiconductor module 10. Furthermore, it is preferable that the fastening portions 12 be formed on the outer sides of multilayer substrates 20 (described later) when viewed in a plan view. Positioning the fastening portions 12 on the outer sides of the multilayer substrates 20 prevents excessive stress from being applied to the multilayer substrates 20 and makes it possible to avoid damage to the multilayer substrates 20.

A mounting hole 14 is formed in each of the fastening portions 12. The mounting holes 14 are holes that go through the fastening portions 12 in the up-down direction of the semiconductor module 10. The mounting holes 14 allow fasteners such as screws (not illustrated in the figures) to be inserted in order to fasten the cooler (described later; not illustrated in the figures) to the bottom surface of the semiconductor module 10. In the present example, the mounting holes 14 are included at a total of two locations, one in each respective fastening portion 12. However, the positions and number of the mounting holes 14 are not limited to this example. For example, when the fastening portions 12 are arranged at a total of two locations running along opposite sides of the rectangular shape formed by the semiconductor module 10 when viewed from above, the mounting holes 14 may be formed at a total of four locations (two along each side). Forming the mounting holes 14 near the outer edges of the semiconductor module 10 makes it possible to reliably fasten the cooler or the like even if bending or warping occurs in the bottom surface of the semiconductor module 10. Furthermore, it is preferable that the mounting holes 14 be formed on the outer sides of the multilayer substrates 20 (described later) when viewed in a plan view. Positioning the mounting 14 on the outer sides of the multilayer substrates 20 prevents excessive stress from being applied to the multilayer substrates 20 and makes it possible to avoid damage to the multilayer substrates 20.

As illustrated in FIG. 1C, within the case 11, the semiconductor module 10 includes semiconductor elements 24, the multilayer substrates 20, and connectors 31. The rear surfaces of the multilayer substrates 20 are exposed from the bottom surface of the semiconductor module 10 (the surface positioned on the negative Z-axis direction side).

The connectors 31 electrically and mechanically connect the side faces of the heat radiating plates 23 of the multilayer substrates 20 to the fastening portions 12. In FIG. 1C, the connectors 31 are partially embedded within the case 11 and partially exposed by the mounting holes 14 formed in the fastening portions 12 of the case 11. One end of each connector 31 is connected to the side face of the respective heat radiating plate 23 inside the case 11. The other end of each connector 31 is exposed from the inner surface of the respective mounting hole 14 formed in the respective fastening portion 12. The exposed portions of the connectors 31 may be substantially coplanar with the inner surfaces of the mounting holes 14 or may protrude out from the inner surfaces of the mounting holes 14. The connectors 31 may be plate-shaped, rod-shaped, or wire-shaped. The connectors 31 are made of an electrically conductive material. Furthermore, it is preferable that the connectors 31 be made of an elastic material. More specifically, it is preferable that the Young's modulus of the connectors 31 be 50 E/GPa to 200 E/GPa. It is preferable that the connectors 31 be made of iron, copper, nickel, titanium, an alloy containing at least one of these materials, or the like. Moreover, it is preferable that the connectors 31 be thinner than the heat radiating plates 23 and have a thickness of 0.1 mm to 5 mm. Connectors 31 of this type can be fitted between the fastening portions 12 and the side faces of the heat radiating plates 23 in a compressively deformed manner. Due to being under compressive stress, the connectors 31 do not shift in position during manufacture of the semiconductor module 10 or when fixing the semiconductor module 10 to the cooler. This makes it possible to easily maintain the electrical connections without the risk of gaps forming near the connection points.

In the present example, the connectors 31 are embedded within the case 11 except for the portions exposed by the mounting holes 14. Moreover, there is one connector 31 per multilayer substrate 20. However, the positions and number of the connectors 31 are not limited to this example. For example, the connectors 31 may be exposed from the rear surface of the case 11 (the surface positioned on the negative Z-axis direction side). Moreover, as will be described later, the connectors 31 may be positioned on the outside of the rear surface (the surface positioned on the negative Z-axis direction side) side of the case 11, for example.

Figure 2A:
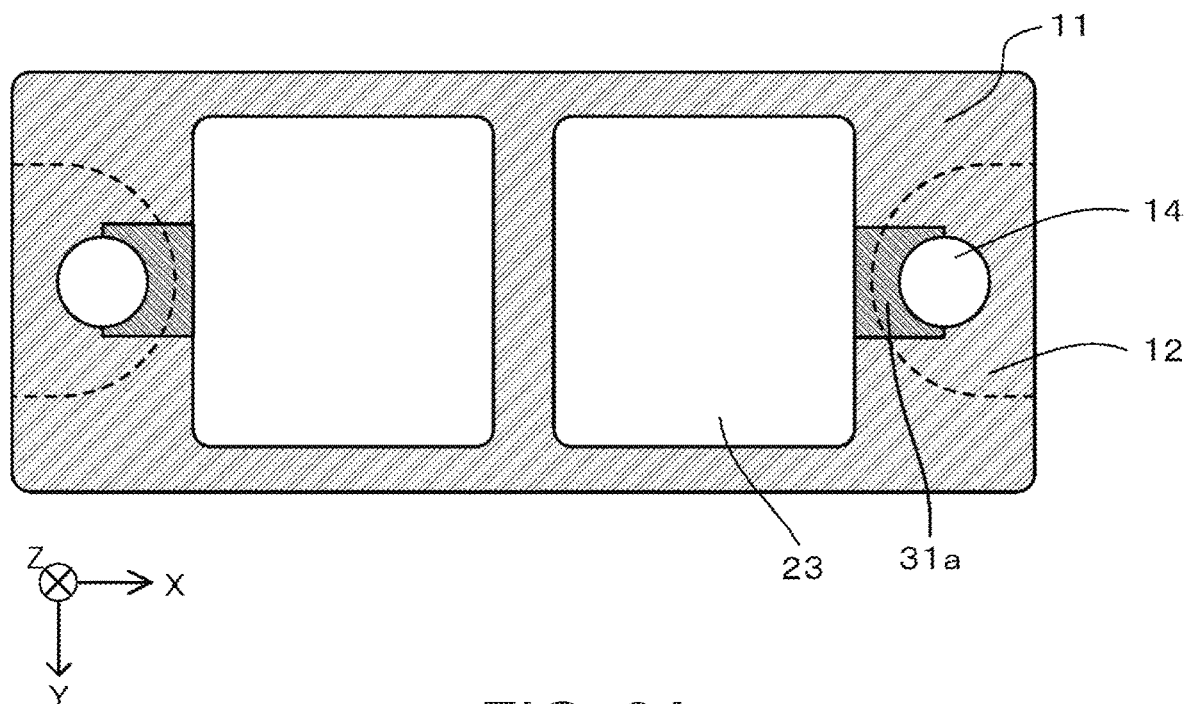
FIG. 2A illustrates an example of a shape for an elastic connector.
Figure 2B:
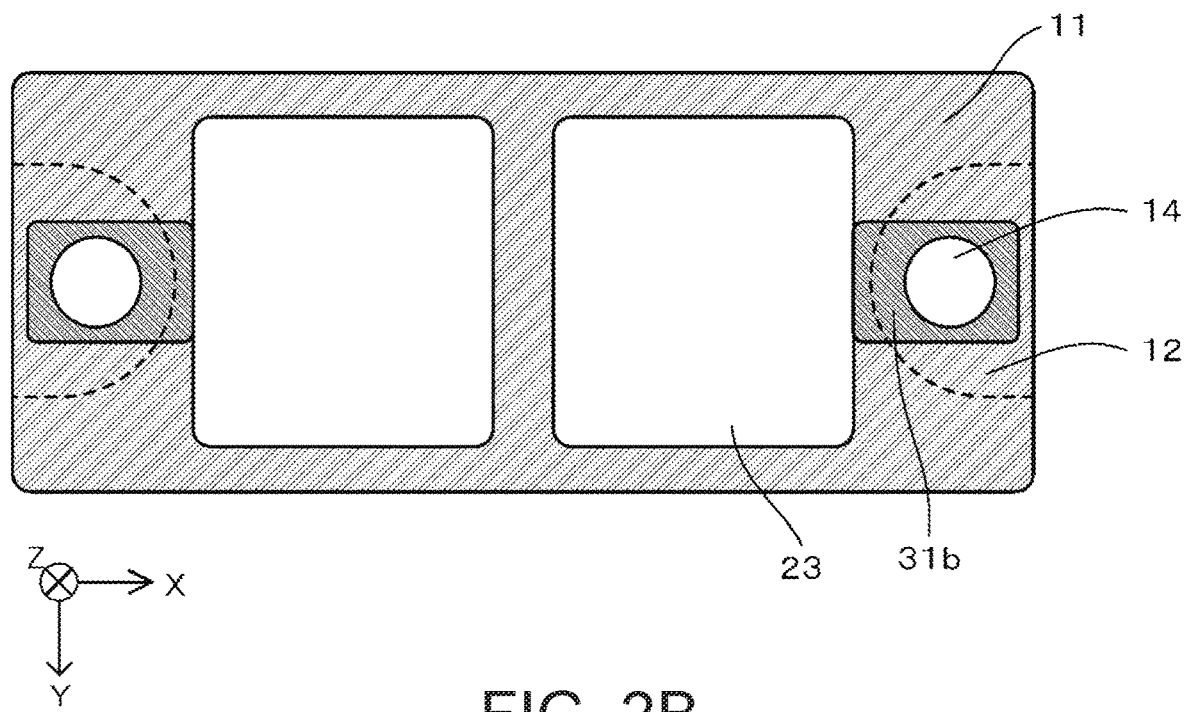
FIG. 2B illustrates an example of a shape for an elastic connector.
Figure 2C:
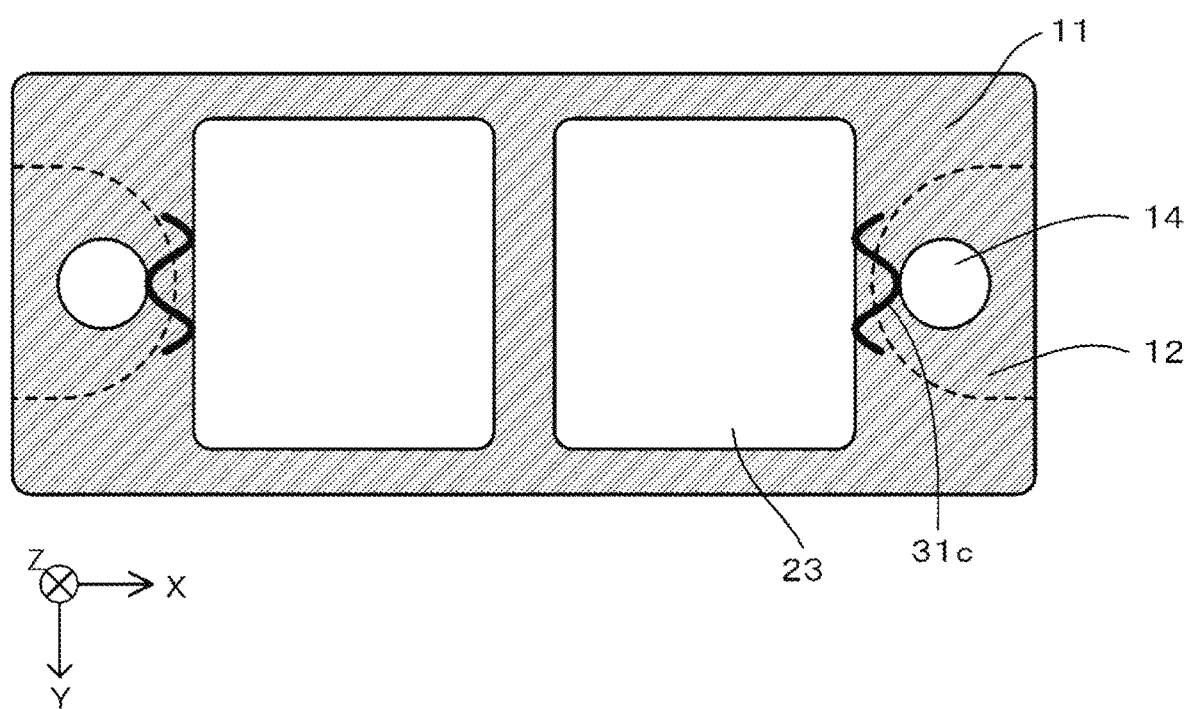
FIG. 2C illustrates an example of a shape for an elastic connector.

FIGS. 2A to 2C illustrate examples of shapes for the connectors 31. FIGS. 2A to 2C are cross-sectional views taken along line B-B in FIG. 1C. FIGS. 2A and 2B illustrate plate-shaped connectors 31a and 31b, with the primary surfaces of these plate shapes being arranged parallel to the rear surfaces of the heat radiating plates 23 (the XY plane). In FIGS. 2A to 2C, one end of each plate-shaped connector 31 (i.e., one of 31a to 31c) is electrically and mechanically connected to the side face of the respective heat radiating plate 23, and the other end of each plate-shaped connector 31 31 (i.e., one of 31a to 31c) is electrically and mechanically connected to the respective fastening portion 12. In FIG. 2A, the other ends of the plate-shaped connectors 31a curve in a manner corresponding to the inner peripheries of the mounting holes 14 in the fastening portions 12 and are exposed from the inner peripheries of the mounting holes 14. In FIG. 2B, the other ends of plate-shaped connectors 31b include through holes formed in a manner corresponding to the inner peripheries of the mounting holes 14 in the fastening portions 12, and the inner peripheries of these through holes are exposed from the inner peripheries of the mounting holes 14. Moreover, the plate-shaped connectors 31a and 31b in FIGS. 2A and 2B may be leaf springs including curved portions between the heat radiating plates 23 and the mounting holes 14. For example, these members may be leaf springs that undulate in the Z-axis direction. This creates elasticity in the direction in which the heat radiating plates 23 and the mounting holes 14 are coupled (the X direction). With the plate-shaped connectors 31a and 31b, arranging the one ends to be pressed against the mounting hole 14-side side faces of the heat radiating plates 23 makes contact failures less likely to occur. In FIG. 2C, wire-shaped connectors 31c are W-shaped wire springs arranged between the heat radiating plates 23 and the mounting holes 14. Each wire-shaped connector 31c has elasticity in the direction in which the heat radiating plates 23 and the mounting holes 14 are coupled (the X direction), with the W-shape being pressed against the mounting hole 14-side side face of the respective heat radiating plate 23 at two locations and being exposed from the inner periphery of the respective mounting hole 14 at one other location. The connectors 31 are not limited to the examples described above, and helical compression springs, helical torsion springs, or the like can also be used.

The case 11 covers the semiconductor elements 24 and the front surfaces of the multilayer substrates 20 (the surfaces positioned on the positive Z-axis direction side) and forms the external shape of the semiconductor module 10. The case 11 may be a molded structure that also acts as a seal for the semiconductor elements 24 and the front surfaces of the multilayer substrates 20. The case 11 is formed utilizing a molding process using a thermosetting resin, for example. Examples of such resins include epoxy resins having an inorganic filler mixed in, and the like.

Moreover, the case 11 may be a frame-shaped or box-shaped insulating resin case having a housing region therewithin, for example. The case houses the semiconductor elements 24 and the front surfaces of the multilayer substrates 20 within the housing region. Furthermore, the case may include external connection terminals 13 respectively having one end extending into the housing region of the case and another end protruding to outside of the semiconductor module 11. Such a case can be formed by utilizing an injection molding process using a thermoplastic resin, for example. Examples of such resins include polyphenylene sulfide (PPS), polybutylene terephthalate (PBT) resins, polybutylene succinate (PBS) resins, polyamide (PA) resins, acrylonitrile butadiene styrene (ABS) resins, and the like. In addition, the housing region in the case can be filled with a sealing material to seal the semiconductor elements inside the housing region. Examples of such sealing materials include epoxy resins, silicone gels, and the like.

Each multilayer substrate 20 includes an insulating board 22, a heat radiating plate 23 formed on the rear surface (the surface on the negative Z-axis side) of the insulating board 22, and a conductive board 21 formed on the front surface (the surface on the positive Z-axis side) of the insulating board 22. The conductive board 21, the insulating board 22, and the heat radiating plate 23 are all substantially plate-shaped, and the multilayer substrate 20 is also plate-shaped. When viewed in a plan view, the external shape of the insulating board 22 is larger than the external shape of the heat radiating plate 23 and the external shape of the conductive board 21. Therefore, the edges of the insulating board 22 extend out beyond the heat radiating plate 23 and the conductive board 21. The front surface (the surface on the positive Z-axis side) of the heat radiating plate 23 is bonded to the insulating board 22, and the rear surface (the surface on the negative Z-axis side) of the heat radiating plate 23 is exposed from the bottom surface of the semiconductor module 10. Note that in FIGS. 1A to 1C, the number and shapes of the multilayer substrates 20 and the conductive boards 21 on the multilayer substrates 20 are only examples, and other numbers or shapes may be used. For example, in a given semiconductor module 10, there may be one multilayer substrate 20, or there may be three or more multilayer substrates 20.

Each heat radiating plate 23 has side faces between the front surface and rear surface thereof. Here, "side faces of the heat radiating plate 23" refers to all faces formed between the two opposing primary surfaces of the plate-shaped heat radiating plate. In FIG. 1C, the side faces of each heat radiating plate 23 are the faces that join the edges of the front surface and rear surface of the heat radiating plate 23 and run orthogonal (in the YZ plane) to the front surface and rear surface of the heat radiating plate 23 (XY plane). However, the direction of the side faces of the heat radiating plates 23 is not limited to this example. The side faces of each heat radiating plate 23 may be faces that are slanted relative to the front surface and rear surface (XY plane) and have a Miller index of (101), for example. The side faces of the heat radiating plates 23 may also be curved faces. Moreover, the side faces of the heat radiating plates 23 may have recesses or protrusions. In this case, all surfaces of the recesses and protrusions formed in the side faces would be referred to as "side faces".

The rear surface of each heat radiating plate 23 is substantially coplanar with the bottom surface of the case 11 or protrudes out (in the negative Z-axis direction) from the bottom surface of the case 11. When the rear surface of the heat radiating plate 23 protrudes out from the bottom surface of the case 11, the side faces of the heat radiating plate 23 are also partially exposed and form a step-shape on the bottom surface of the semiconductor module. When viewed in a plan view, the heat radiating plates 23 are arranged at positions that are surrounded on either side by the plurality of mounting holes 14 and that do not overlap with the mounting holes 14.

Each insulating board 22 is made of an electrically insulating material with excellent thermal conductivity. It is preferable that each insulating board 22 be made of a ceramic with high thermal conductivity, such as aluminum oxide, aluminum nitride, or silicon nitride. It is preferable that the thickness of each insulating board 22 be 0.1 mm to 2 mm. Each insulating board 22 is electrically insulated from the respective heat radiating plate 23 and conductive board 21. Each heat radiating plate 23 is made of an electrically conductive material with excellent thermal conductivity. It is preferable that each heat radiating plate 23 be made of copper, aluminum, an alloy containing at least one of these materials, or the like. Moreover, a plating film made of nickel, gold, or the like may be formed on the surfaces of each heat radiating plate 23. It is preferable that the thickness of each heat radiating plate 23 be 0.1 mm to 5 mm. Each conductive board 21 is made of an electrically conductive material. It is preferable that each conductive board 21 be made of copper, aluminum, an alloy containing at least one of these materials, or the like. Moreover, a plating film made of nickel, gold, or the like may be formed on the surfaces of each conductive board 21. It is preferable that the thickness of each conductive board 21 be 0.1 mm to 5 mm.

Direct-bonded copper (DBC) substrates or active metal brazed (AMB) substrates, for example, can be used as multilayer substrates 20 that have this configuration. The multilayer substrates 20 can transmit heat generated by the semiconductor elements 24 during operation to the cooler (not illustrated in the figures) via the heat radiating plates 23.

Each semiconductor element 24 is bonded to the front surface of the conductive board 21 of the respective multilayer substrate 20 via solder 25. The rear surface of each semiconductor element 24 is electrically connected to the respective conductive board 21, and the front surface of each semiconductor element 24 is electrically connected via wiring members such as conductive wires (not illustrated in the figures) to other conductive boards 21 (not illustrated in the figures) or to the external connection terminals 13. In FIG. 1C, the external connection terminals and wiring members such as conductive wires within the semiconductor module are not explicitly illustrated. The semiconductor elements 24 include switching devices such as insulated-gate bipolar transistors (IGBTs) and power metal-oxide-semiconductor field-effect transistors (MOSFETs), for example. Moreover, the semiconductor elements 24 include diodes such as Schottky barrier diodes (SBDs) and freewheeling diodes (FWDs) as necessary. Furthermore, the semiconductor elements 24 may include reverse-conducting (RC) IGBTs in which an IGBT and an FWD are integrated within a single device. The semiconductor elements 24 may be made of a silicon semiconductor or may be made of a silicon carbide semiconductor. Here, FIG. 1C depicts a configuration in which two of the semiconductor elements 24 are included as an example. The configuration is not limited to this example, and there may be a single semiconductor element 24, or there may be three or more semiconductor elements 24.

A method of manufacturing the semiconductor module 10 according to the present embodiment will be described. First, the semiconductor elements 24 and wiring members such as wires and external connection terminals (not illustrated in the figures) are mounted on the multilayer substrates 20. Next, the multilayer substrates 20 with the semiconductor elements 24 mounted thereon and the connectors 31 are set inside a form die. At this time, the multilayer substrates 20 are set with the bottom surfaces of the heat radiating plates 23 pressed against the surface of the form die. The connectors 31 are fitted between the side faces of the heat radiating plates 23 of the multilayer substrates 20 and pins in the form die that will become the mounting holes 14. Then, a molding process is performed using transfer molding. This yields the semiconductor module 10 including the connectors 31. Here, it is preferable that the connectors 31 be made of an elastic material. Using an elastic material makes it possible to fit the connectors 31 between the mounting holes 14 and the side faces of the heat radiating plates 23 in a compressively deformed manner, thereby making it possible to easily achieve electrical connections without the risk of the resin that flows during the molding process creating gaps at the connection points.

Another method of manufacturing the semiconductor module 10 according to the present embodiment will be described. First, the connectors 31 are set inside a form die. The external connection terminals 13 may also be set inside the form die at this time if necessary. The form die has a frame-shaped space into which resin will flow. In other words, the form die includes, inside a frame-shaped portion, an inner block (into which resin will not flow) for forming the housing region in which the multilayer substrate and the like will be arranged. At this time, one end of each connector 31 contacts the inner block of the form die where the heat radiating plates will be affixed later, while the other end contacts a pin in the form die that will become a mounting hole 14. Next, an insert molding process is performed using injection molding. This yields a case in which the connectors 31 are embedded. Here, one end of each connector 31 that will be connected to a side face of a heat radiating plate 23 as well as the other end that will be connected to a fastener (described later) are exposed from the case, while the other portions are embedded within the case. Next, multilayer substrates 20 on which the semiconductor elements 24 and wiring members such as wires (not illustrated in the figures) are mounted are bonded inside the housing region in the case using an adhesive or the like. At this time, the one ends of the connectors 31 that are exposed from the case are electrically and mechanically connected to the side faces of heat radiating plates 23. Furthermore, the housing region in the case 11 may be filled with a sealing material. This yields the semiconductor module 10 including the connectors 31.

The semiconductor module 10 according to the present embodiment includes the connectors 31 that are electrically and mechanically connected to the side faces of the conductive heat radiating plates 23 and to the fastening portions 12 of the case 11. Therefore, the heat radiating plates 23 can be electrically connected via the fastening portions 12 to external members such as the cooler. This prevents differences in electric potential from developing between the heat radiating plates 23 and external members such as the cooler, thereby making it possible to suppress the occurrence of partial discharges.

Embodiment 2

Figure 3:
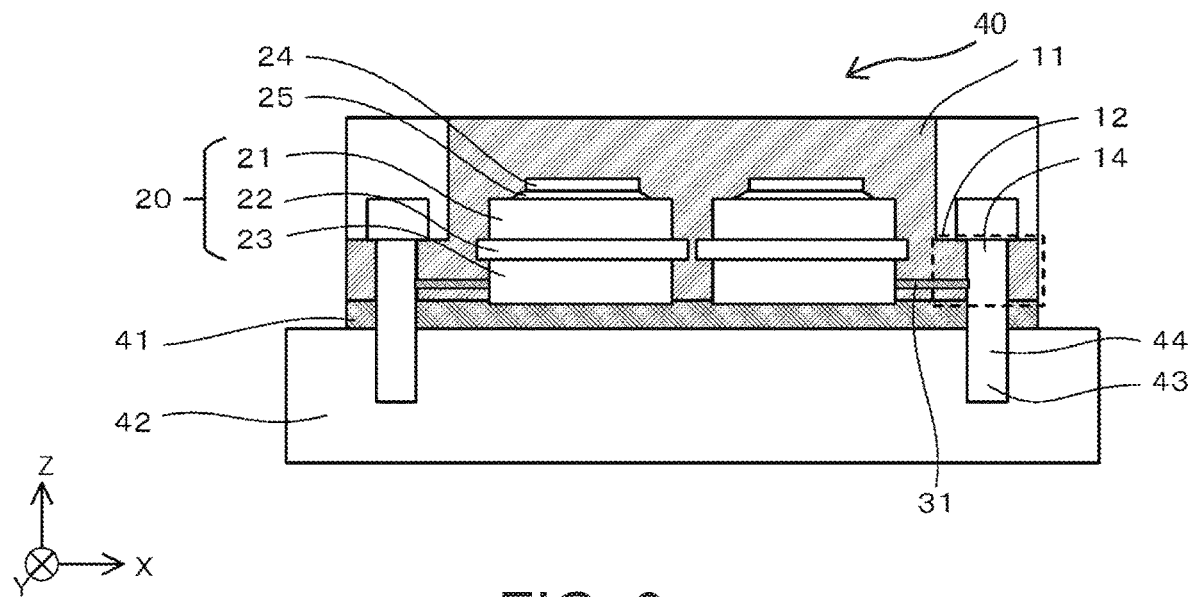
FIG. 3 is a cross-sectional view of a semiconductor device according to Embodiment 2 of the present invention.

FIG. 3 is a cross-sectional view schematically illustrating a semiconductor device 40 according to the present embodiment. The semiconductor device 40 includes a semiconductor module 10 and a conductive cooler 42 arranged on the bottom surface of the semiconductor module 10 (the XY plane on the negative Z-axis direction side) with a thermally conductive member 41 interposed therebetween. In the semiconductor device 40, screws 44 (conductive fasteners)

are inserted into mounting holes 14 formed in fastening portions 12 of a case 11 and threaded into screw holes 43 in the conductive cooler 42. In this way, the cooler 42 is fastened to the semiconductor module 10. Moreover, the semiconductor module 10 includes connectors 31 which are electrically and mechanically connected to side faces of heat radiating plates 23 and to the fastening portions 12. One end of each connector 31 is exposed from the interior of the case 11 and is electrically and mechanically connected to a side face of the respective heat radiating plate 23. The other end of each connector 31 is exposed from the inner periphery of the mounting hole 14 formed in the respective fastening portion 12 and is electrically and mechanically connected to the respective screw 44 (fastener). The screws 44 are threaded into the screw holes 43 in the cooler 42 and are thereby electrically and mechanically connected to the cooler 42. Thus, the heat radiating plates 23 are electrically connected to the cooler 42 via the connectors 31 and the screws 44. Meanwhile, in the semiconductor device 40, the thermally conductive member 41 is electrically insulating, and therefore there is no electrical connection between the heat radiating plates 23 and the cooler 42 via the thermally conductive member 41.

In the screws 44, the seating surfaces of the head portions are seated against the front surfaces of the attaching portions 12 in the case 11, and the body portions are inserted through the mounting holes 14 in the case 11 and threaded into the screw holes 43 in the cooler 42. These screws 44 are electrically conductive. It is preferable that the screws 44 be made of iron, copper, aluminum, an alloy containing at least one of these materials, or the like. Due to the screws 44 being electrically conductive, the heat radiating plates 23 can be electrically connected to the cooler 42 via the screws 44.

For the cooler 42, a cooler having a plurality of radiating fins, a cooler having formed therein channels through which a coolant such as water can flow, or the like can be used, for example. The cooler 42 is electrically conductive. It is preferable that the cooler 42 be made of aluminum, copper, or iron (which have excellent thermal conductivity); an alloy containing at least one of these materials; or the like, for example. Furthermore, in order to improve corrosion resistance, a material such as nickel may be formed on the surfaces using a plating process or the like, for example. More specifically, examples of materials other than nickel include nickel-phosphorus alloys, nickel-boron alloys, and the like.

The thermally conductive member 41 is arranged between the bottom surface of the semiconductor module 10 and the upper surface of the cooler 42. When viewed in a plan view, the thermally conductive member 41 should cover at least the rear surfaces of the heat radiating plates 23. The thermally conductive member 41 may also be arranged spanning across the entire bottom surface of the semiconductor module 10. The thermally conductive member 41 may be a thermally conductive grease paste formed by mixing a filler with high thermal conductivity into a flexible grease or resin, for example. Moreover, the thermally conductive member 41 may be a thermally conductive sheet constituted by a sheet-shaped resin having a filler with high thermal conductivity dispersed therewithin, for example. The thermally conductive member 41 is made of an electrically insulating material to prepare for situations in which the thermally conductive member 41 escapes to outside of the semiconductor device 40. A thermally conductive grease can be made of a grease such as modified silicone and a filler with excellent thermal conductivity such as aluminum oxide, magnesium oxide, silicon oxide, aluminum nitride, silicon nitride, or boron nitride. A thermally conductive sheet can be made of a resin such as silicone or an epoxy and a filler with excellent thermal conductivity such as aluminum oxide, magnesium oxide, silicon oxide, aluminum nitride, silicon nitride, or boron nitride.

Next, a method of manufacturing the semiconductor device 40 according to the present embodiment will be described. First, a thermally conductive member 41 constituted by a thermally conductive grease is applied to the bottom surface of the semiconductor module 10 or to the upper surface of the cooler 42 using a screen printing process or the like. Next, the cooler 42 is arranged on the bottom surface of the semiconductor module 10 with the thermally conductive member 41 interposed therebetween. Then, the screws 44 are inserted through the mounting holes 14 in the semiconductor module 10 and threaded into the screw holes 43 in the cooler 42 until a prescribed tightening torque is achieved. This makes it possible to manufacture the semiconductor device 40, in which the semiconductor module 10 and the cooler 42 are fastened together with the thermally conductive member 41 interposed therebetween. Moreover, rather than applying a thermally conductive grease, a thermally conductive sheet may be sandwiched between the bottom surface of the semiconductor module 10 and the upper surface of the cooler 42.

The semiconductor device 40 according to the present embodiment includes the semiconductor module 10 which includes the connectors 31 electrically connecting the heat radiating plates 23 and the fastening portions 12, as well as the conductive cooler which, using conductive fasteners (the screws 44), is affixed to the rear surfaces of the conductive heat radiating plates 23 with the electrically insulating thermally conductive member 41 interposed therebetween. Therefore, the heat radiating plates 23 are electrically connected to the cooler 42 via the connectors 31 and the screws 44. This prevents differences in electric potential from developing between the heat radiating plates 23 and the cooler 42, thereby making it possible to suppress the occurrence of partial discharges.

Embodiment 3

Figure 4:
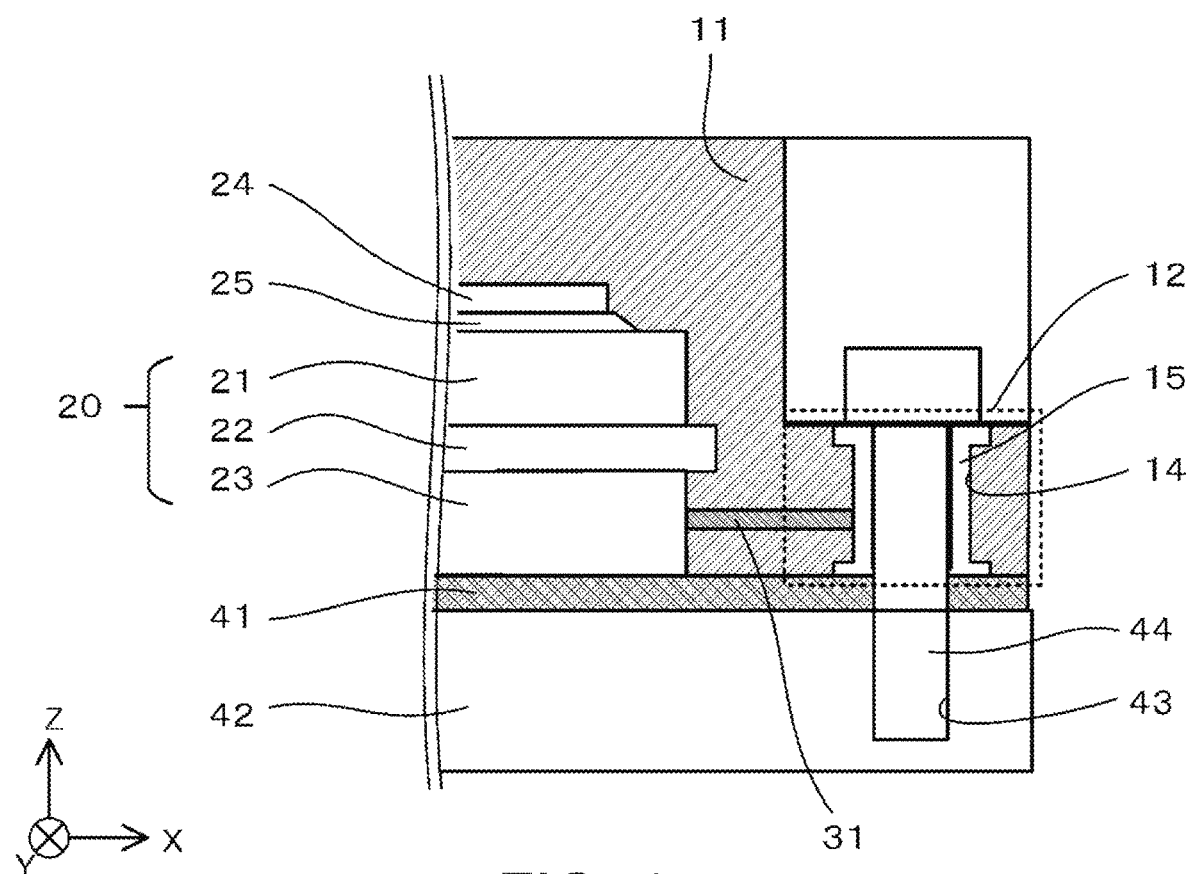
FIG. 4 is a partial cross-sectional view of a semiconductor module according to Embodiment 3 of the present invention.

A semiconductor module 10 according to the present embodiment will be described with reference to FIG. 4. FIG. 4 is a partial cross-sectional view of an area near a fastening portion 12 of the semiconductor module 10 according to the present embodiment. The semiconductor module 10 according to the present embodiment includes a conductive ring 15 on the inner surface of a mounting hole 14. This ring in the fastening portion 12 should be formed in the mounting holes 14 in all of the fastening portions 12. A fastener such as a screw 44 for fastening a cooler 42 such as radiating fins to the bottom surface side of the semiconductor module 10 is inserted through the ring 15. The outer peripheral surface of the ring 15 is electrically and mechanically connected to a connector 31. In other words, one end of the connector 31 is electrically and mechanically connected to a side face of a heat radiating plate 23, and the other end is electrically and mechanically connected to the outer peripheral surface of the ring 15. The inner peripheral surface and both end faces near the openings of the ring 15 are electrically and mechanically connected to the screw 44 (fastener).

The ring 15 may have a circular tube shape with a through hole going therethrough. As illustrated in FIG. 4, the ring 15 may have flanges at the openings of the circular tube shape. The flanges may be formed at both of the two openings or at either one of the two openings. The outer peripheral surface of the ring 15 contacts the resin from which a case 11 is made, while the inner peripheral surface is exposed. The length of the ring 15 (position in the Z-axis direction) may be greater than, less than, or equal to the length of the mounting hole 14 (length in the Z-axis direction). It is preferable that the length of the ring 15 be greater than the length of the mounting hole 14 but less than a length obtained by adding the thickness of the flanges (described later) to the length of the mounting hole 14. The position of the ring 15 (position in the Z-axis direction) should be at a position that covers the exposed portion of the connector 31 on the inner periphery of the mounting hole 14. It is preferable that the ring 15 be formed spanning from one opening of the mounting hole 14 to the other opening. This allows the ring 15 to also function as a reinforcement to the case 11 when fastening with screws, thereby making it possible to improve the mechanical reliability of the semiconductor module 10. The upper end of the ring 15 (end on the positive Z-axis direction side) may extend up (in the positive Z-axis direction) from the upper surface of the case 11. It is preferable that the amount by which the ring 15 extends be less than or equal to 1 mm. This makes it easier to electrically connect the ring 15 and the screw 44 (fastener). The lower end of the ring 15 (end on the negative Z-axis direction side) may extend down (in the negative Z-axis direction) from the bottom surface of the case 11. Here, the amount by which the ring 15 extends may be greater than the thickness of a thermally conductive member 41. It is preferable that the amount by which the ring 15 extends be 0.05 mm to 1 mm. This allows the ring 15 to extend out further towards the cooler 42 side than the thermally conductive member 41, which makes it easier to electrically connect the ring 15 and the cooler 42.

The ring 15 should be made of an electrically conductive material. It is preferable that the ring 15 be made of iron, copper, nickel, titanium, an alloy containing at least one of these materials, or the like.

In the semiconductor module 10 according to the present embodiment, a conductive screw is inserted through the through hole in the ring 15 and fastened into the cooler. Upon doing this, the conductive screw and the ring 15 become electrically connected. For example, electrical connections are formed between the inner surface of the through hole in the ring 15 and the outer surface of the shaft portion of the screw as well as between the opening of the ring 15 and the head portion of the screw. This makes it possible to easily achieve an electrical connection between the heat radiating plates 23 and external members such as the cooler. This more easily prevents differences in electric potential from developing between the heat radiating plates 23 and external members such as the cooler, thereby making it possible to suppress the occurrence of partial discharges. Furthermore, arranging the ring 15 in the fastening portion 12 allows the ring 15 to also function as a reinforcement to the case 11 when fastening with screws, thereby making it possible to improve the mechanical reliability of the semiconductor module 10.

Embodiment 4

A semiconductor module according to the present embodiment will be described with reference to FIGS. 5 to 7. In a semiconductor module 10 according to the present embodiment, on the bottom surface of the semiconductor module 10, heat radiating plates 23 and rings 15 protrude downwards (in the negative Z-axis direction) from a case 11, and connectors 31 are attached on the outside of the case 11.

Figure 5:
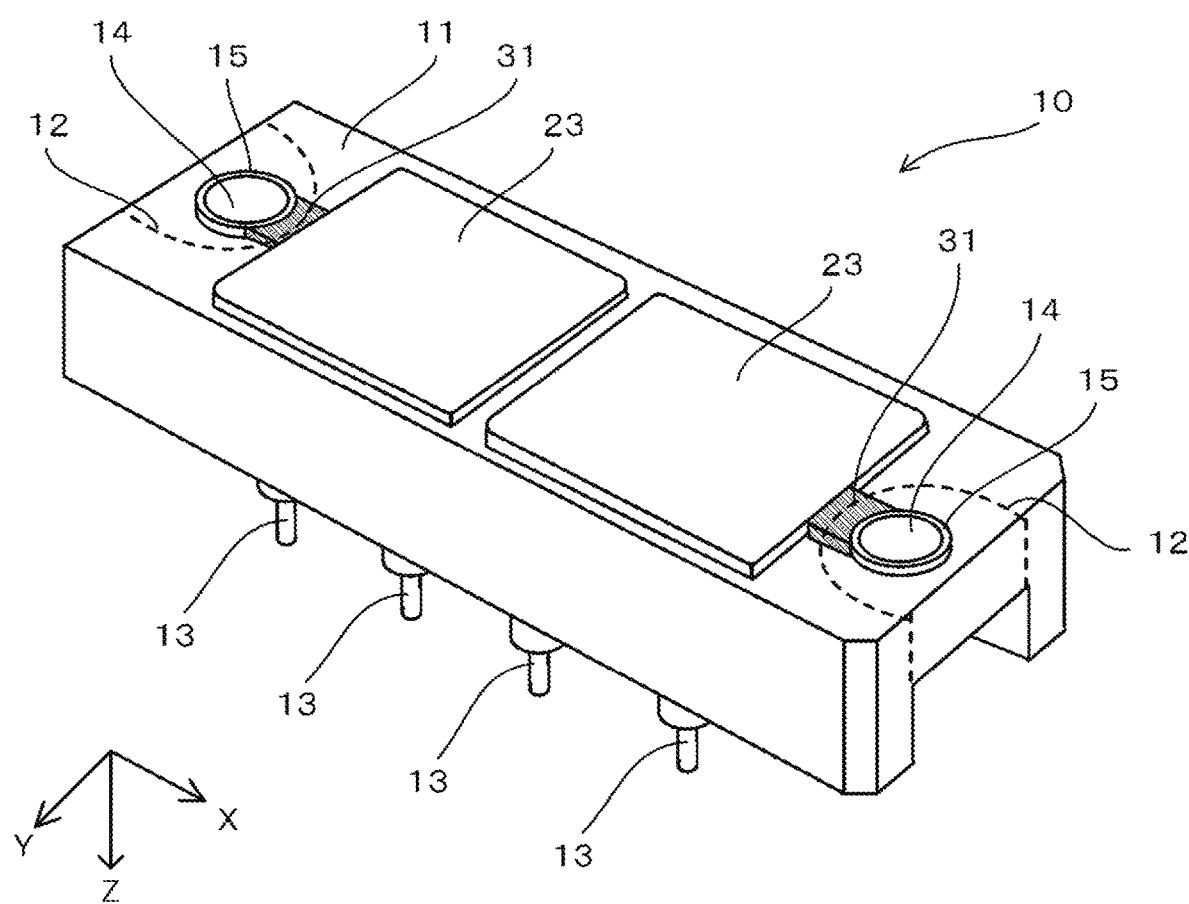
FIG. 5 is a perspective view of a semiconductor module according to Embodiment 4 of the present invention as viewed from a lower perspective direction.
Figure 6:
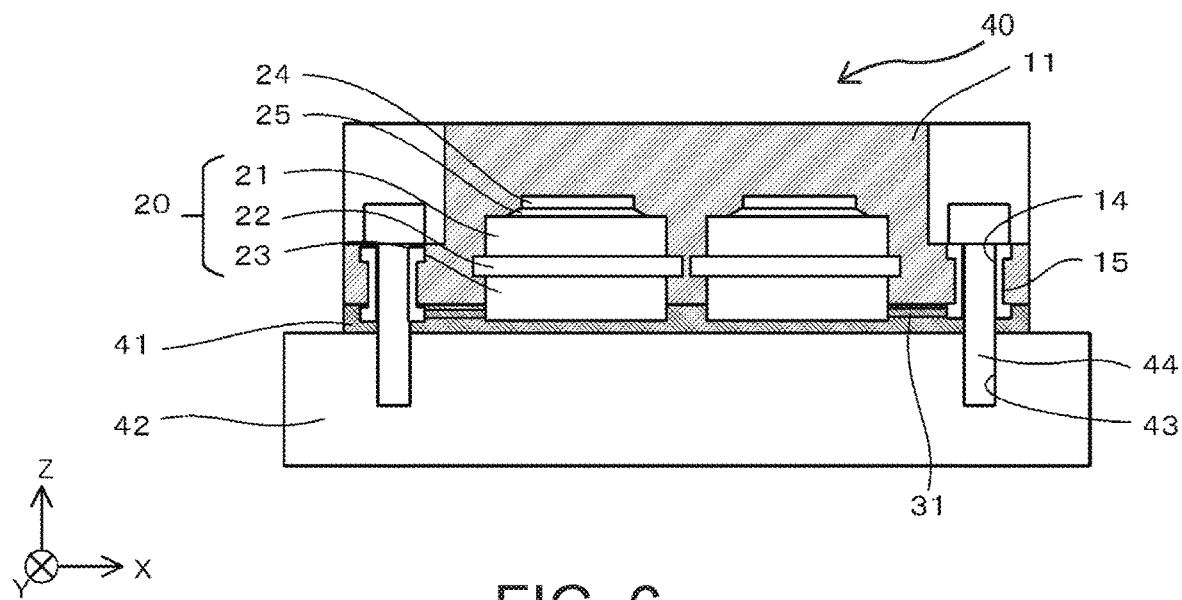
FIG. 6 is a cross-sectional view of a semiconductor device according to Embodiment 4 of the present invention.

FIG. 5 illustrates the semiconductor module 10 according to the present embodiment with the semiconductor module 10 being viewed from a lower perspective direction and shows the bottom surface and several side faces of the semiconductor module 10. FIG. 6 is a cross-sectional view schematically illustrating a semiconductor device 40 according to the present embodiment. In the semiconductor module 10 according to the present embodiment, on the bottom surface of the case 11, the connectors 31 are attached between the heat radiating plates 23 and mounting holes 14. The mounting holes 14 are formed in fastening portions 12 in the case 11, and rings 15 are included inside the mounting holes 14. On the bottom surface of the semiconductor module 10, the rings 15 protrude out from the bottom surface of the case 11. It is preferable that the exposed amount of the rings 15 be 0.1 mm to 5 mm. Moreover, on the bottom surface of the semiconductor module 10, the heat radiating plates 23 protrude out from the bottom surface of the case 11. It is preferable that the exposed amount of the heat radiating plates 23 be 0.1 mm to 5 mm. Furthermore, the connectors 31 are attached between the side faces of the heat radiating plates 23 and the side faces of the rings 15 that are protruding outwards.

Figure 7:
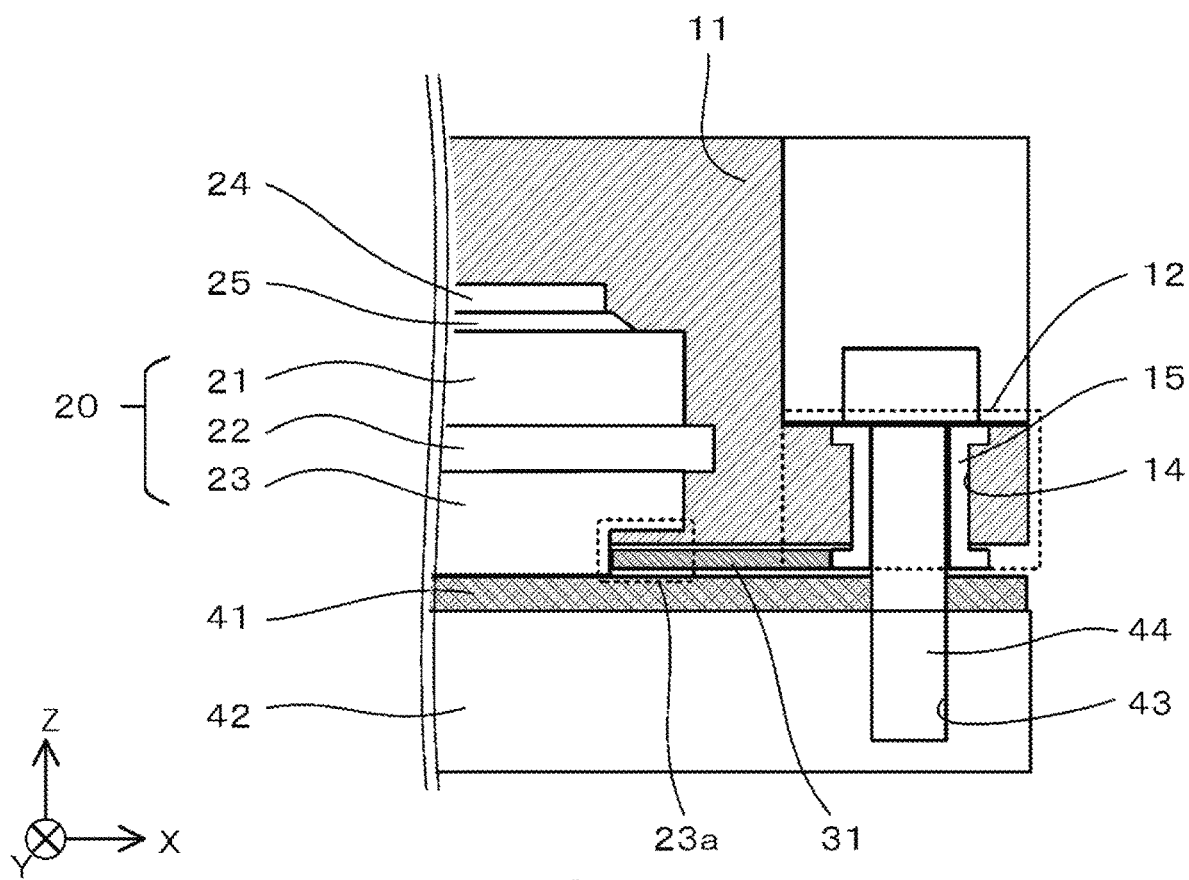
FIG. 7 is a cross-sectional view of a semiconductor device according to a modification example of Embodiment 4 of the present invention.

FIG. 7 is a cross-sectional view schematically illustrating a semiconductor device 40 according to a modification example of the present embodiment. This semiconductor module 10 includes a notch 23a in the corner formed by the bottom surface and mounting hole 14-side side face of the heat radiating plate 23. The notch 23a should be positioned in a portion that contacts the connector 31 when viewed in a plan view. Furthermore, the connector 31 is attached between the ring 15 and the notch 23a in the heat radiating plate 23. It is preferable that the depth of the notch 23a from the bottom surface of the heat radiating plate 23 be at least 1.0 times the thickness of the connector 31 and no more than 0.5 times the thickness of the heat radiating plate. Moreover, it is preferable that the height (upper end in the Z-axis direction) of the notch 23a be slightly above (in the positive Z-axis direction) the bottom surface of the case 11 and that the upper face of the notch 23a be covered with resin. This makes it possible to firmly affix the multilayer substrate 20 to the case 11. It is preferable that the length of the notch 23a from the side face of the heat radiating plate 23 be 0.1 mm to 1 mm. On the bottom surface of the semiconductor module 10, the bottom surface of the heat radiating plate 23 protrudes further down (in the Z-axis direction) than the bottom surface of the case 11. The connector 31 is electrically and mechanically connected to the side face of the heat radiating plate 23 and to the outer peripheral surface of the ring 15.

Embodiment 5

A semiconductor module according to the present embodiment will be described with reference to FIGS. 8 to 10. In a semiconductor module 10 according to the present embodiment, on the bottom surface of the semiconductor module 10, there are grooves 16 in the bottom surface of a case 11, and connectors 31 are attached inside the grooves 16.

Figure 8:
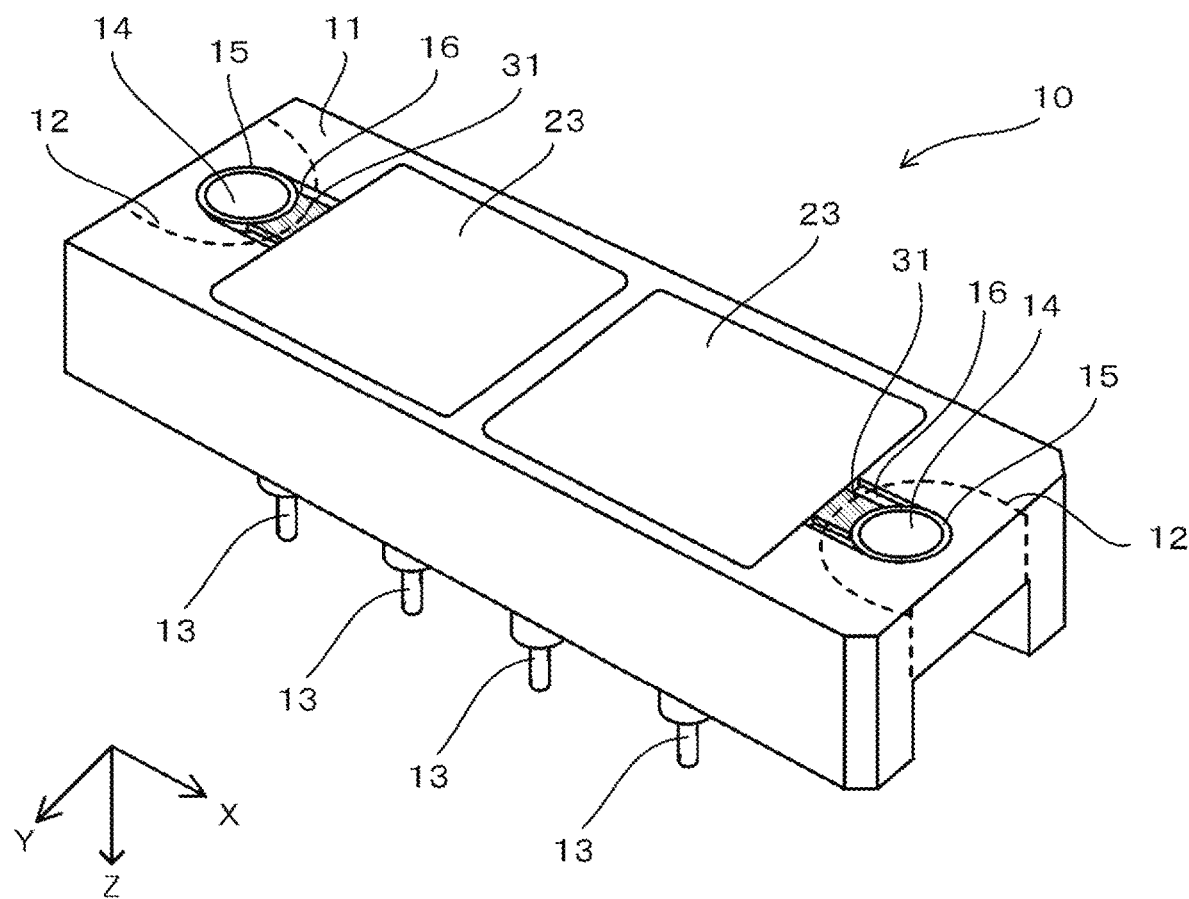
FIG. 8 is a perspective view of a semiconductor module according to Embodiment 5 of the present invention as viewed from a lower perspective direction.
Figure 9:
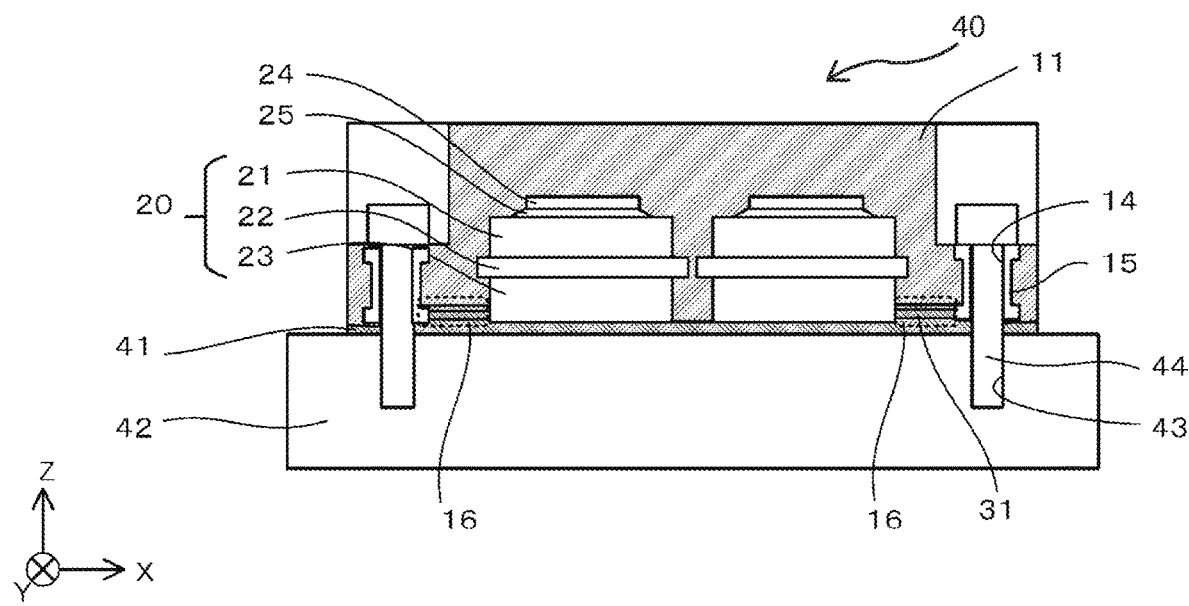
FIG. 9 is a cross-sectional view of a semiconductor device according to Embodiment 5 of the present invention.

FIG. 8 illustrates the semiconductor module 10 according to the present embodiment with the semiconductor module 10 being viewed from a lower perspective direction and shows the bottom surface and several side faces of the semiconductor module 10. FIG. 9 is a cross-sectional view schematically illustrating a semiconductor device 40 according to the present embodiment. In the semiconductor module 10 according to the present embodiment, on the bottom surface of the case 11, there are grooves 16 between heat radiating plates 23 and mounting holes 14, and the connectors 31 are attached inside the grooves 16. In this semiconductor module 10, on the bottom surface of the semiconductor module 10, the bottom surfaces of the heat radiating plates 23 and the bottom portions of rings 15 are substantially coplanar with the bottom surface of the case 11. In the bottom surface of the case 11, the grooves 16 are formed in regions that join the mounting holes 14 and the side faces of the heat radiating plates 23, and on the bottom surface of the semiconductor module 10, the bottom surfaces of the heat radiating plates 23 are positioned further downward (in the Z-axis direction) than the bottom surfaces of the grooves 16. The side faces of the heat radiating plates 23 and the side faces of the rings 15 are exposed by the grooves 16. Furthermore, the connectors 31 are attached between the side faces of the heat radiating plates 23 and the side faces of the rings 15 that are exposed by the grooves 16. The depth of the grooves 16 should be deep enough that the connectors 31 do not protrude out from the bottom surface of the semiconductor module 10. It is preferable that the depth of the grooves 16 be 0.1 mm to 5 mm. The width of the grooves 16 should be greater than or equal to the width of the connectors 31. It is preferable that the width of the grooves 16 be at least 1.0 times and no more than 1.2 times the width of the connectors 31.

Figure 10:
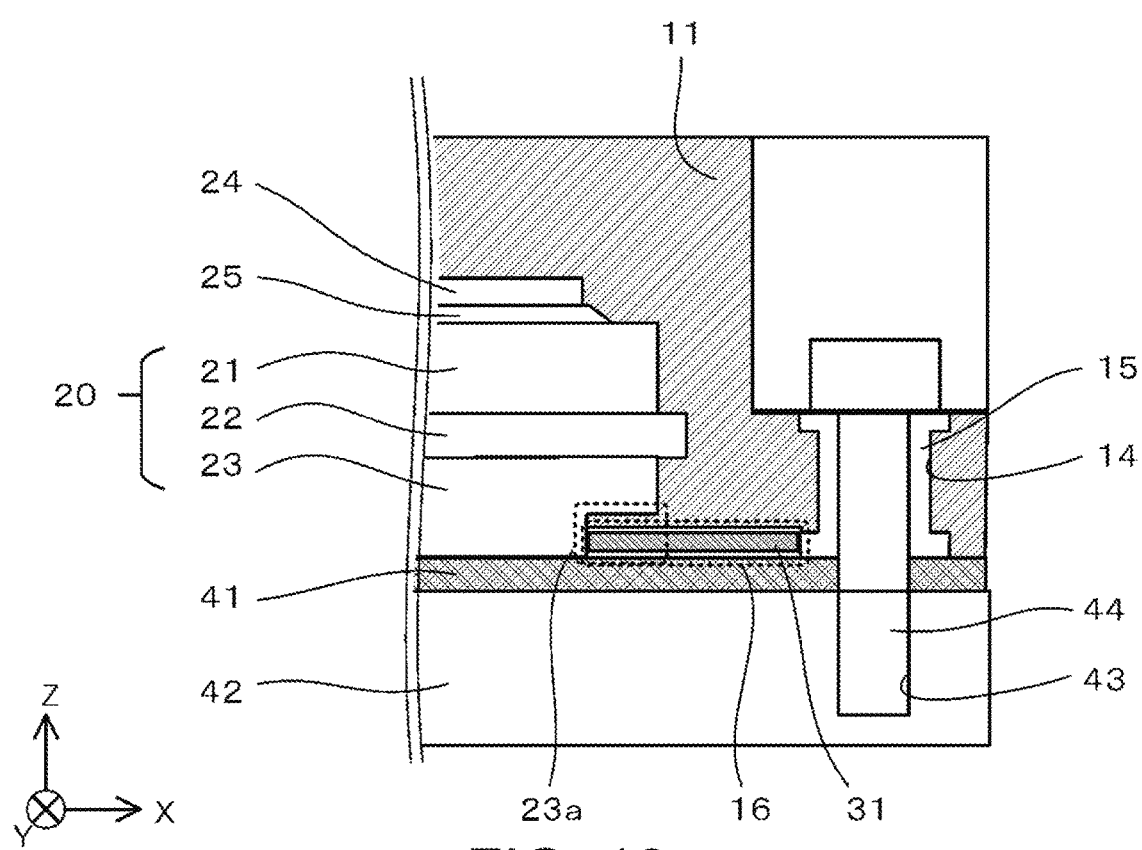
FIG. 10 is a cross-sectional view of a semiconductor device according to a modification example of Embodiment 5 of the present invention.

FIG. 10 is a cross-sectional view schematically illustrating a semiconductor device 40 according to a modification example of the present embodiment. This semiconductor module 10 has a groove 16 on the bottom surface of the case 11. Furthermore, the heat radiating plate 23 has a notch 23a. The connector 31 should be fitted into the groove 16 so as to contact the side face of the notch 23a in the heat radiating plate. The notch 23a is included in the corner formed by the bottom surface and mounting hole 14-side side face of the heat radiating plate 23. The notch 23a should be positioned in a portion that is connected to the groove 16 when viewed in a plan view. It is preferable that the depth of the notch 23a from the bottom surface of the heat radiating plate 23 be at least 1.0 times the thickness of the connector 31 and no more than 0.5 times the thickness of the heat radiating plate. Moreover, it is preferable that the height (upper end in the Z-axis direction) of the notch 23a be above (in the positive Z-axis direction) the bottom surface of the groove 16 and that the upper face of the notch 23a be covered with resin. This makes it possible to firmly affix the multilayer substrate 20 to the case 11. It is preferable that the length of the notch 23a from the side face of the heat radiating plate 23 be 0.1 mm to 1 mm. On the bottom surface of the semiconductor module 10, the bottom surface of the heat radiating plate 23 is positioned further downward (in the Z-axis direction) than the bottom surface of the groove 16. The connector 31 is, within the groove 16, electrically and mechanically connected to the side face of the heat radiating plate 23 and to the outer peripheral surface of the ring 15.

Embodiments 3 to 5 were described as including the rings 15. However, even without the rings 15, the connectors 31 can still be electrically connected to the inner surfaces of the mounting holes 14.

For example, by forming hooks that latch onto the connectors 31 near the mounting holes 14 in the bottom surface of the case 11, the connectors 31 can be attached between the side faces of the heat radiating plates 23 and the inner surfaces of the mounting holes 14, with the connectors being partially exposed on the inner surfaces of the mounting holes 14.

Similar to in Embodiment 2, each of the semiconductor modules 10 according to Embodiments 3 to 5 can be fastened to a cooler 42 with a thermally conductive member 41 interposed therebetween to manufacture a semiconductor device 40. In this way, the heat radiating plates 23 and the cooler 42 can be electrically connected in such a semiconductor device 40 according to the present embodiment as well.

Embodiment 6

Figure 11:
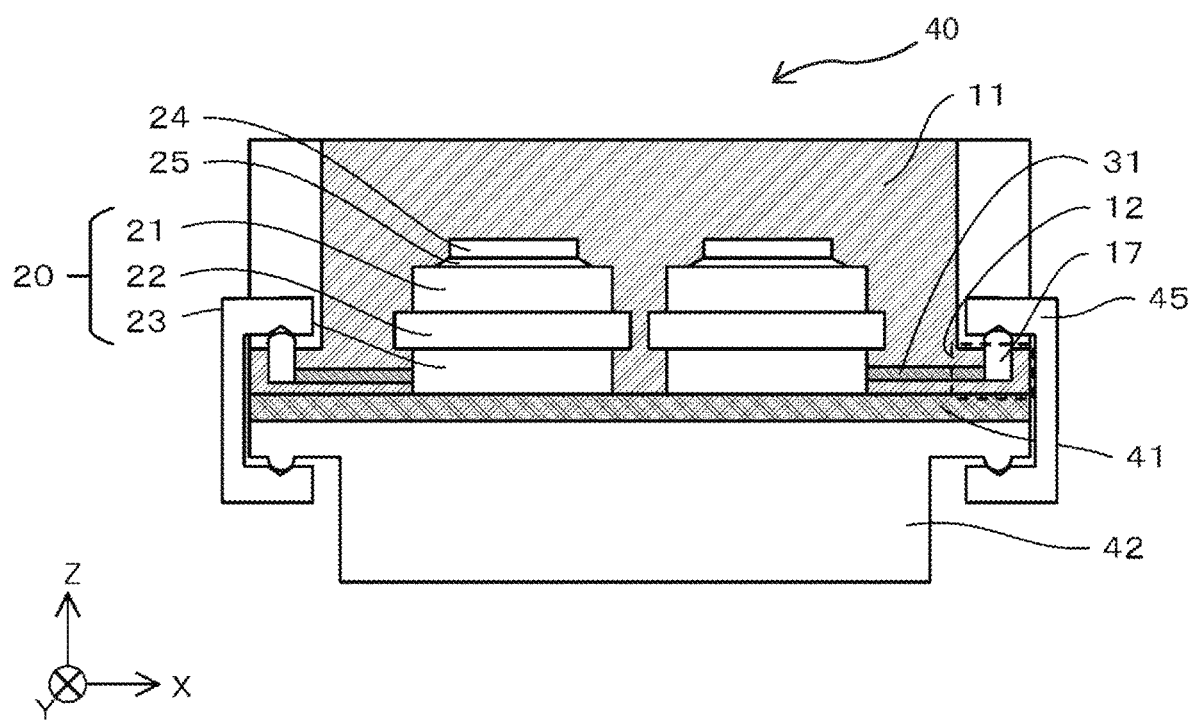
FIG. 11 is a cross-sectional view of a semiconductor device according to Embodiment 6 of the present invention.

A semiconductor device 40 according to the present embodiment will be described with reference to FIG. 11. FIG. 11 is a cross-sectional view schematically illustrating the semiconductor device 40 according to the present embodiment. The semiconductor device 40 includes a semiconductor module 10 including semiconductor elements 24, multilayer substrates 20, and a case 11; a cooler 42 arranged on the bottom surface of the semiconductor module 10 with a thermally conductive member 41 interposed therebetween; and clamps 45 (fasteners). The case 11 has eaves-shaped fastening portions 12 that protrude out from the sides. Moreover, the cooler 42 also has eaves-shaped fastening portions that protrude out from the sides of the cooler 42 at positions facing those in the case 11.

The semiconductor module 10 includes contact terminals 17 and connectors 31. The contact terminals 17 are embedded in the eaves-shaped fastening portions 12 protruding out from the sides of the case 11, with the contact portions protruding from the fastening portions 12 towards the upper surface side of the case 11. The contact terminals 17 may be cylindrical. Furthermore, the ends of the protruding portions of the contact terminals 17 may be hemispherical. It is preferable that the contact terminals 17 be made of iron, copper, or aluminum (which are electrically conductive); an alloy containing at least one of these materials; or the like. The surfaces may be plated with a material such as gold or nickel. One end of each connector 31 is electrically and mechanically connected to a side face of a respective heat radiating plate 23, and the other end is electrically and mechanically connected to the respective contact terminal 17.

Similar to in Embodiment 2, the semiconductor module 10 according to the present embodiment can be fastened to the cooler 42 with the thermally conductive member 41 interposed therebetween to manufacture the semiconductor device 40. This makes it possible to provide a semiconductor module 10 in which the heat radiating plates 23 and the cooler 42 can be electrically connected.

In the semiconductor device 40, the fastening portions of the case 11 and the fastening portions of the cooler 42 are sandwiched together by the clamps 45. In this way, the cooler 42 is fastened to the semiconductor module 10. Moreover, in the semiconductor device 40, the contact terminals 17 and the clamps 45 are electrically and mechanically connected at the fastening portions 12 of the case 11, and the clamps 45 and the cooler 42 are electrically and mechanically connected at the fastening portions of the cooler 42. Therefore, the heat radiating plates 23 and the cooler 42 are electrically connected.

In the fastening portions of the cooler 42, protrusions that serve as cooler 42-side contact points may be formed at positions corresponding to the contact terminals 17 in the negative Z-axis direction. These protrusions that serve as cooler 42-side contact points may have hemispherical ends. Forming contact points on the cooler 42 side as well reduces single loading when fastening with the clamps 45 and allows the semiconductor module 10 and the cooler 42 to be fixed together more closely.

It is preferable that the clamps 45 be made of iron, copper, or aluminum (which are electrically conductive); an alloy containing at least one of these materials; or the like. Moreover, recesses may be formed in the clamps 45 at positions corresponding to the contact terminals 17 and the cooler 42-side contact points. Forming recesses in the clamps 45 makes the clamps 45 less likely to get dislodged.

Although in FIG. 11 the semiconductor module 10 is depicted as including the contact terminals 17 and the connectors 31 as an example, the present embodiment is not limited to this configuration. For example, one end of each connector 31 may be electrically and mechanically connected to a respective heat radiating plate 23, and the other end of each connector 31 may be exposed from the fastening portions of the case 11 and be electrically and mechanically connected to a respective clamp 45.

Similar to in Embodiment 2, the heat radiating plates 23 and the cooler 42 can be electrically connected in the semiconductor device 40 according to the present embodiment as well. This prevents differences in electric potential from developing between the heat radiating plates 23 and external members such as the cooler 42, thereby making it possible to suppress the occurrence of partial discharges.

Embodiment 7

Figure 12A:
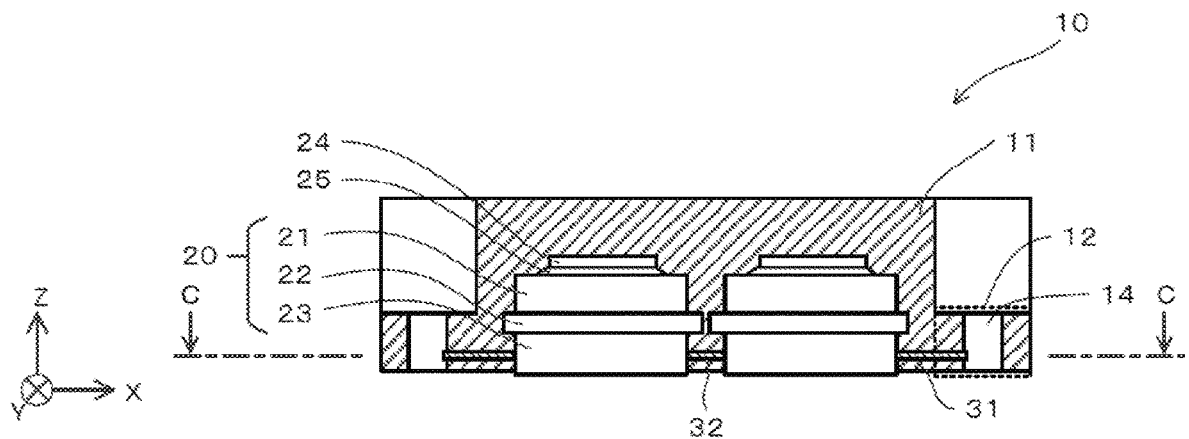
FIG. 12A is a cross-sectional view of a semiconductor device according to Embodiment 7 of the present invention.
Figure 12B:
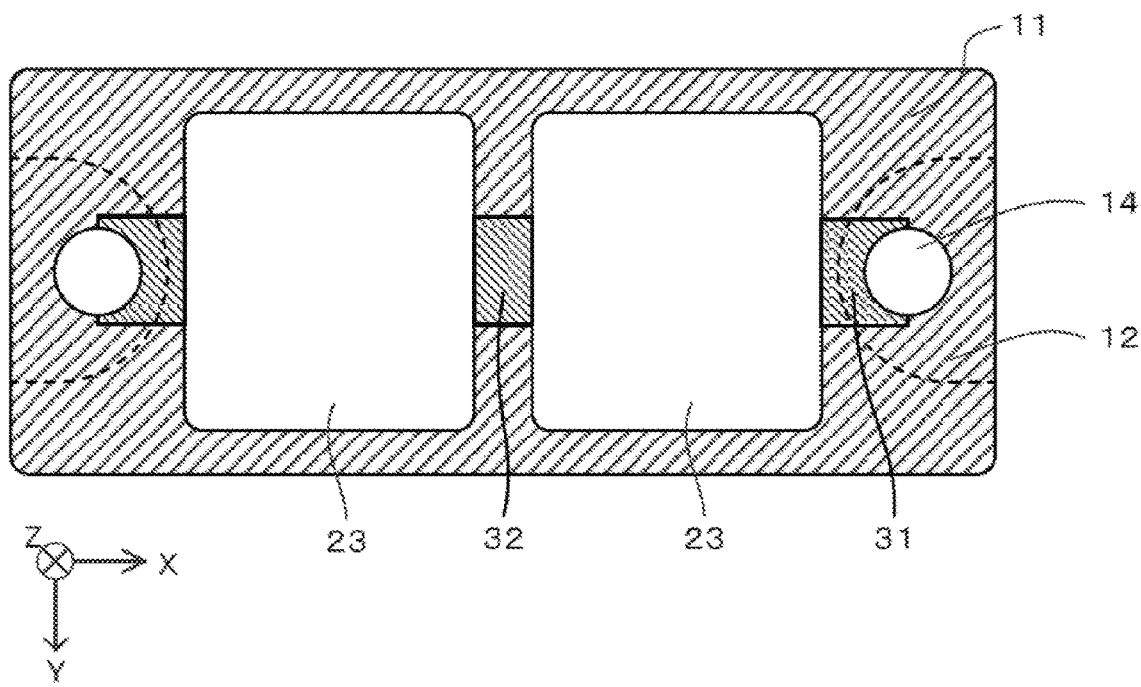
FIG. 12B is a bottom view of the semiconductor module according to Embodiment 7 of the present invention.

A semiconductor module 10 according to Embodiment 7 of the present invention will be described with reference to FIGS. 12A and 12B. In Embodiment 7, a connector 32 is added to the semiconductor device 40 of Embodiment 1. In the semiconductor module 10 of the present embodiment, there are two separate heat-radiating plates 23, and a connector 32 is provided to electrically connect respective side faces of the heat radiating plates together. The connector 32 is made of an electrically conductive material. Further, it is preferable that the connector 32 is elastic. Preferably, the connector 32 is made of the same material as that of the connectors 31 respectively connecting the heat radiating plates 23 and fastening portions 12. Preferably, the connector 32 is thinner than the heat radiating plates 23. Preferably, the connector 32 has the same thickness as the connectors 31 respectively connecting the heat radiating plates 23 and fastening portions 12. In this example, the connector 32 is located in the center of the semiconductor module 10 in a plan view, and is embedded in the case 11. The position of the connector 32, however, is not limited by this example. For example, the rear surface (the surface in the negative Z-axis direction) of the connector 32 may be exposed from the case 11. Or, the connector 31 may be provided on or at the exterior of the rear surface (the surface in the negative Z-axis direction) of the case 11. The connector 32 of this type can be fitted between the respective side faces of the heat radiating plates 23 in a compressively deformed manner. Due to being under compressive stress, the connector 32 does not shift in position during manufacture of the semiconductor module 10 or when fixing the semiconductor module 10 to the cooler. This makes it possible to easily maintain the electrical connections without the risk of gaps forming near the connection points.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor module, comprising:
a multilayer substrate including an insulating board, a conductive board formed on a front surface of the insulating board, and a heat radiating plate formed on a rear surface of the insulating board;
a semiconductor element arranged on the conductive board;
a case that houses at least the semiconductor element and a front surface of the multilayer substrate and includes a fastening portion to receive an electrically conductive fastener and grooves in a bottom surface of the case; and
an electrically conductive connector physically contacting a side face of the heat radiating plate on one end thereof and electrically connecting to the fastening portion on another end thereof so as to electrically connect the side face of the heat radiating plate with the electrically conductive fastener when the fastening portion receives the electrically conductive fastener,
wherein a notch in which the electrically conductive connector is arranged is formed in the side face of the heat radiating plate,
wherein a through hole is formed in the fastening portion spanning from an upper surface to a bottom surface,
wherein the electrically conductive connector is electrically connected to the side face of the heat radiating plate and to an inner surface of the through hole in the fastening portion,
wherein the semiconductor module further comprise a conductive ring within an inner periphery of the through hole, and
wherein said one end of the electrically conductive connector is electrically and mechanically connected to the side face of the heat radiating plate, and another end of the electrically conductive connector is electrically and mechanically connected to the ring in the fastening portion;
a cooler arranged under the heat radiating plate;
wherein the heat radiating plate is electrically connected to the cooler via the electrically conductive connector and the electrically conductive fastener and the electrically conductive connector is attached inside the grooves.

2. The semiconductor module according to claim 1, wherein the electrically conductive connector is made of an elastic material.

3. The semiconductor module according to claim 1, wherein a rear surface of the heat radiating plate is exposed from the bottom surface of the case.

4. The semiconductor module according to claim 1, wherein the groove is formed between the heat radiating plate and the fastening portion, and a portion of the side face of the heat radiating plate is exposed from the case by the groove.

5. A semiconductor device, comprising:
a semiconductor module including:
a multilayer substrate including an insulating board, a conductive board formed on a front surface of the insulating board, and a heat radiating plate formed on a rear surface of the insulating board;

a semiconductor element arranged on the conductive board;

a case that houses at least the semiconductor element and a front surface of the multilayer substrate and includes a fastening portion to receive an electrically conductive fastener and grooves in a bottom surface of the case; and an electrically conductive connector physically contacting a side face of the heat radiating plate on one end thereof and electrically connecting to the fastening portion on another end thereof so as to electrically connect the side face of the heat radiating plate with the electrically conductive fastener when the fastening portion receives the electrically conductive fastener, wherein a notch in which the electrically conductive connector is arranged is formed in the side face of the heat radiating plate, wherein a through hole is formed in the fastening portion spanning from an upper surface to a bottom surface, wherein the electrically conductive connector is electrically connected to the side face of the heat radiating plate and to an inner surface of the through hole in the fastening portion, wherein the semiconductor module further comprise a conductive ring within an inner periphery of the through hole, and wherein said one end of the electrically conductive connector is electrically and mechanically connected to the side face of the heat radiating plate and another end of the electrically conductive connector is electrically and mechanically connected to the ring in the fastening portion;

an electrically insulating thermally conductive member arranged on a bottom surface of the semiconductor module;

a cooler arranged underneath the electrically insulating thermally conductive member; and said electrically conductive fastener fastening together the semiconductor module and the cooler, wherein the heat radiating plate is electrically connected to the cooler via the electrically conductive connector and the electrically conductive fastener and the electrically conductive connector is attached inside the grooves.

6. The semiconductor device according to claim 5, wherein the electrically conductive fastener is a screw.

* * * * *